United States Patent
Yang et al.

(10) Patent No.: US 7,777,522 B2
(45) Date of Patent: Aug. 17, 2010

(54) CLOCKED SINGLE POWER SUPPLY LEVEL SHIFTER

(75) Inventors: Jianan Yang, Austin, TX (US); Wang K. Chen, Austin, TX (US); Stephen G. Jamison, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 12/183,739

(22) Filed: Jul. 31, 2008

(65) Prior Publication Data

US 2010/0026343 A1 Feb. 4, 2010

(51) Int. Cl.
*H03K 19/0175* (2006.01)
(52) U.S. Cl. .............................. 326/68; 326/63; 326/81; 326/95; 326/98; 327/333
(58) Field of Classification Search .................... 326/63, 326/68, 81, 95, 98; 327/333
See application file for complete search history.

(56) References Cited

U.S. PATENT DOCUMENTS

| | | | |
|---|---|---|---|
| 4,982,111 A | | 1/1991 | Nakaizumi |
| 5,530,392 A | * | 6/1996 | Runas et al. ................. 327/333 |
| 5,818,264 A | * | 10/1998 | Ciraula et al. ................. 326/98 |
| 5,892,385 A | | 4/1999 | Hashiguchi |
| 6,255,853 B1 | * | 7/2001 | Houston ....................... 326/98 |
| 6,351,173 B1 | * | 2/2002 | Ovens et al. ................. 327/333 |
| 6,762,957 B2 | * | 7/2004 | Hsu et al. ................. 365/189.05 |
| 6,842,046 B2 | * | 1/2005 | Tzartzanis et al. ............. 326/98 |
| 6,954,100 B2 | * | 10/2005 | Dharne et al. ................. 327/333 |
| 7,109,757 B2 | * | 9/2006 | Yuan et al. ..................... 326/95 |
| 7,119,578 B2 | | 10/2006 | Correale, Jr. et al. |
| 7,315,183 B2 | | 1/2008 | Hinterscher et al. |
| 7,443,223 B2 | * | 10/2008 | Bajkowski et al. .......... 327/333 |
| 2003/0222699 A1 | * | 12/2003 | Carpenter et al. ........... 327/333 |
| 2009/0251173 A1 | * | 10/2009 | Zhang et al. ................... 326/81 |

OTHER PUBLICATIONS

Zhang et al; "Single-Supply, Single-Ended Level Conversion Circuit for an Integrated Circuit Having Multiple Power Supply Domains"; U.S. Appl. No. 12/099,485, filed Apr. 8, 2008.
Khan et al; "A Single Supply Level Shifter for Multi-Voltage Systems"; IEEE 19th International Conference on VLSI Design, 2006.

* cited by examiner

*Primary Examiner*—Vibol Tan
(74) *Attorney, Agent, or Firm*—Daniel D. Hill; Robert L. King (57) ABSTRACT

First circuitry is powered by a first power supply domain and provides a data signal referenced to the first power supply domain. Second circuitry is powered by a second power supply domain that differs from the first power supply domain. The data signal becomes referenced to the second power supply domain by a clocked level shifter that couples the first circuitry to the second circuitry and buffers the data signal from the first power supply domain to the second power supply domain by only using a single supply voltage. The clocked level shifter is clocked by a signal that is used to precharge a first node and a second node of the clocked level shifter until the data signal is valid for at least a setup time period. The first and second nodes are precharged to establish a known state in the clocked level shifter.

20 Claims, 3 Drawing Sheets

FIG. 3

US 7,777,522 B2

CLOCKED SINGLE POWER SUPPLY LEVEL SHIFTER

BACKGROUND

1. Field

This disclosure relates generally to level shifters, and more specifically, to a clocked single power supply level shifter.

2. Related Art

Reducing power consumption has become increasingly important in integrated circuits due to, for example, wide spread use of battery powered portable and handheld applications. There are various ways to reduce power consumption. For example, power consumption may be reduced by lowering the supply voltage. However, in certain electronic applications, it is difficult for all circuits to be low voltage circuits. Thus, circuits using high voltage power supplies may be connected together with circuits using low voltage power supplies. In such applications, when providing a signal to a high voltage circuit from a low voltage circuit, a level shifter, or level conversion, circuit is used to shift the voltage of the signal.

In multi-core system-on-a-chip (SoC) integrated circuits, two or more power supply domains may be used to achieve optimum speed, power, and reliability. Logic signals are conveyed from one power supply voltage domain to another power supply voltage domain using level shifting circuits implemented at boundaries between the domains. In a conventional level shifter circuit, a "crowbar" leakage current path may develop for certain voltage levels causing increased power consumption. Also, a conventional level shifter may require two power supply voltages to fully level shift a signal. A level shifter supplied by two power supply voltages causes routing congestion at the boundary between the two power supply domains. In addition, a conventional level shifter may only translate a logic high or a logic low voltage. Some applications may require that both the high and low logic levels be translated at the same time.

Therefore, what is needed is a level shifter that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a level shifter that receives a clock signal and is connected to only one power supply voltage. The level shifter includes a first level shifter portion and a second level shifter portion. The level shifter uses a first feedback signal from the output of the first level shifter portion to turn off a P-channel device to prevent a crowbar current when an input signal is a logic high. Also, the level shifter includes an N-channel device transistor in the first level shifter portion controlled by a feedback signal from the second level shifter portion to prevent a crowbar current when the input is a logic low. Likewise, in the described embodiment, the second level shifter portion receives feedback signals to control leakage current in a similar manner. Internal nodes of the first and second level shifter portions are precharged to a known state using the clock signal prior to the input signals being received. Control circuits are provided for synchronizing the input signal with the clock signal.

The level shifter in accordance with the described embodiment can shift both the high and low logic states of a input signal for a wide range of voltage levels. Also, there is no crowbar current during operation. In addition, functionality is not sensitive to integrated circuit manufacturing processing variations. Further, because the level shifter is supplied with only one power supply voltage, only one set of power supply conductors need be routed at the boundary between power supply domains.

In one aspect, there is provided, a circuit comprising: first circuitry having a first set of first and second power terminals for being powered by a first power supply domain, the first circuitry providing a data signal referenced to the first power supply domain; second circuitry having a second set of first and second power terminals for being powered by a second power supply domain having supply voltages that differ from the first power supply domain, the second circuitry providing the data signal referenced to the second power supply domain; and a clocked level shifter for coupling the first circuitry to the second circuitry, the clocked level shifter buffering the data signal from the first power supply domain to the second power supply domain by only using a single supply voltage wherein voltage values on both the first and second power terminals of the second set differ from the first and second power terminals of the first set, the clocked level shifter being clocked by a clock signal that is used to precharge a first node and a second node of the clocked level shifter until the data signal is valid for at least a setup time period, precharging the first and second nodes being used to establish a known state in the clocked level shifter. The clocked level shifter may further comprise: a first level shifter portion having a data input for receiving the data signal, the first level shifter portion comprising: a first inverter coupled to the data input and having an output coupled to the first node; a first transistor coupled in series between the first power terminal of the second set and the first inverter, the first transistor having a control terminal; a second transistor coupled in series between the first inverter and the second power terminal of the second set; a second inverter having an input coupled to the first node and an output coupled to the control terminal of the first transistor; and a first precharge transistor coupled between the first power terminal of the second set and the first node, the first precharge transistor having a control terminal for receiving the clock signal; and a second level shifter portion having a data input for receiving the data signal, the second level shifter portion comprising: a third inverter coupled to the data input and having an output coupled to the second node; a third transistor coupled in series between the first power terminal of the second set and the third inverter, the third transistor having a control terminal; a fourth transistor coupled in series between the third inverter and the second power terminal of the second set; a fourth inverter having an input coupled to the second node and an output coupled to the control terminal of the second transistor; and a second precharge transistor coupled between the second power terminal of the second set and the second node, the second precharge transistor having a control terminal for receiving an inverse of the clock signal. The circuit may further comprise control circuitry for controlling when a rising edge of the clock signal occurs relative to an edge transition of the data signal. The circuit may further comprise a fifth inverter having an input for receiving the clock signal and an output coupled to the control terminal of the second precharge transistor. The first inverter may further comprise sixth and seventh transistors coupled in series, and the first level shifter portion may further comprise an eighth transistor coupled between the sixth and seventh transistors, the eighth transistor having a control terminal coupled to the clock signal. The third inverter may further comprise ninth and tenth transistors coupled in series, and the second level shifter portion may further comprise an eleventh transistor coupled between the ninth and tenth transistors, the eleventh transistor having a control terminal coupled to the inverse of the clock signal. The circuit may further comprise control circuitry coupled to the clocked level shifter for ensuring that the data signal is valid for at least the setup time period.

In another aspect, there is provided, a circuit comprising: first circuitry within a first power supply domain having a first set of first and second power terminals for being powered by a first power supply and providing a data signal referenced to the first power supply; second circuitry within a second power supply domain having a second set of first and second power terminals for being powered by a second power supply, the second power supply differing from the first power supply, the second circuitry providing the data signal referenced to the second power supply; and a clocked level shifter coupled between the first circuitry and the second circuitry, the clocked level shifter buffering the data signal from the first power supply to the second power supply by only using a single supply voltage, the clocked level shifter using a clock signal to bias an output of the clocked level shifter to a known state, the output not being biased to the known state after a setup time has elapsed upon receipt of valid data, the clocked level shifter comprising a series-connected plurality of transistors, at least one of which is assured of being nonconductive during a valid output state of the clocked level shifter to thereby prevent current leakage. The clocked level shifter may further comprise a first level shifter portion having a data input for receiving the data signal, the first level shifter portion may further comprise: a first inverter coupled to the data input and having an output coupled to a first node; a first transistor coupled in series between the first power terminal of the second set and the first inverter, the first transistor having a control terminal; a second transistor coupled in series between the first inverter and the second power terminal of the second set; a second inverter having an input coupled to the first node and an output coupled to the control terminal of the first transistor; and a first precharge transistor coupled between the first power terminal of the second set and the first node, the first precharge transistor having a control terminal for receiving the clock signal; and a second level shifter portion having a data input for receiving the data signal, the second level shifter portion may further comprise: a third inverter coupled to the data input and having an output coupled to a second node; a third transistor coupled in series between the first power terminal of the second set and the third inverter, the third transistor having a control terminal; a fourth transistor coupled in series between the third inverter and the second power terminal of the second set; a fourth inverter having an input coupled to the second node and an output coupled to the control terminal of the second transistor; and a second precharge transistor coupled between the second power terminal of the second set and the second node, the second precharge transistor having a control terminal for receiving an inverse of the clock signal. The circuit may further comprise control circuitry for controlling when a rising edge of the clock signal occurs relative to an edge transition of the data signal. The circuit may further comprise a fifth inverter having an input for receiving the clock signal and an output coupled to the control terminal of the second precharge transistor. The first inverter may further comprise sixth and seventh transistors coupled in series and the first level shifter portion may further comprise an eighth transistor coupled between the sixth and seventh transistors, the eighth transistor having a control terminal coupled to the clock signal. The third inverter may further comprise ninth and tenth transistors coupled in series and the second level shifter portion may further comprise an eleventh transistor coupled between the ninth and tenth transistors, the eleventh transistor having a control terminal coupled to the inverse of the clock signal. The circuit may further comprise control circuitry coupled to the clocked level shifter for ensuring that the data signal is valid for at least the setup time period. The first power supply domain may comprise first and second power rails and the second power supply domain comprises third and fourth power rails, wherein voltage conducted by the first power rail and the third power rail having differing values and voltage conducted by the second power rail and the fourth power rail is a same voltage value. The first power supply domain may comprise first and second power rails and the second power supply domain may comprise third and fourth power rails, wherein voltage conducted by the first power rail and the third power rail having differing values and voltage conducted by the second power rail and the fourth power rail also have differing values.

In yet another aspect, there is provided, a level shifting circuit comprising: a first transistor of a first conductivity type having a first current electrode coupled to a first power supply terminal referenced to a first voltage domain, a control electrode and a second current electrode; a second transistor of the first conductivity type having a first current electrode coupled to the second current electrode of the first transistor, a control electrode for receiving a data signal referenced to a second voltage domain different from the first voltage domain, and a second current electrode coupled to a first internal node; a third transistor of a second conductivity type having a first current electrode coupled to the second current electrode of the second transistor, a control electrode for receiving a clock signal, and a second current electrode; a fourth transistor of the second conductivity type having a first current electrode coupled to the second current electrode of the third transistor, a control electrode for receiving the data signal, and a second current electrode; a fifth transistor of the second conductivity type having a first current electrode coupled to the second current electrode of the fourth transistor, a control electrode for receiving a leakage current control signal, and a second current electrode coupled to a second power supply terminal referenced to the first voltage domain; a sixth transistor of the first conductivity type having a first current electrode coupled to the first power supply terminal referenced to the first voltage domain, a control electrode for receiving the clock signal, and a second current electrode coupled to the first internal node; and a first inverter having an input coupled to the first internal node, a first power electrode coupled to the first power supply terminal referenced to the first voltage domain, a second power electrode coupled to the second power supply terminal referenced to the first voltage domain, and an output for providing a level shifted form of the data signal as an output signal and coupled to the control electrode of the first transistor. The first, second and sixth transistors may be P-channel transistors and the third, fourth and fifth transistors may be N-channel transistors. The level shifting circuit may further comprise: a seventh transistor of the first conductivity type having a first current electrode coupled to the first power supply terminal referenced to the first voltage domain, a control electrode coupled to the output of the first inverter, and a second current electrode; an eighth transistor of the first conductivity type having a first current electrode coupled to the second current electrode of the seventh transistor, a control electrode for receiving the data signal referenced to the second voltage domain, and a second current electrode; a ninth transistor of the first conductivity type having a first current electrode coupled to the second current electrode of the eighth transistor, a control electrode for receiving an inversion of the clock signal, and a second current electrode coupled to a second internal node; a tenth transistor of the second conductivity type having a first current electrode coupled to the second current electrode of the ninth transistor, a control electrode for receiving the data signal, and a second current electrode; an eleventh transistor of the second conductivity type having a first current electrode coupled to the second current electrode of the tenth transistor, a control electrode for receiving the leakage current control signal, and a second current electrode coupled to the second power supply terminal referenced to the first voltage domain; a twelfth transistor of the first conductivity type having a first current electrode coupled to the second internal node, a control electrode for receiving an inverse of the clock signal, and a second current electrode coupled to the second power supply terminal referenced to the first voltage domain; and a second inverter having an input coupled to the second internal node, a first power electrode coupled to the first power supply terminal referenced to the first voltage domain, a second power electrode coupled to the second power supply terminal referenced to the first voltage domain, and an output for providing the leakage current control signal. The seventh, eighth and ninth transistors may be P-channel transistors and the tenth, eleventh and twelfth transistors may be N-channel transistors.

Each signal described herein may be designed as positive or negative logic, where negative logic can be indicated by a bar over the signal name or a letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
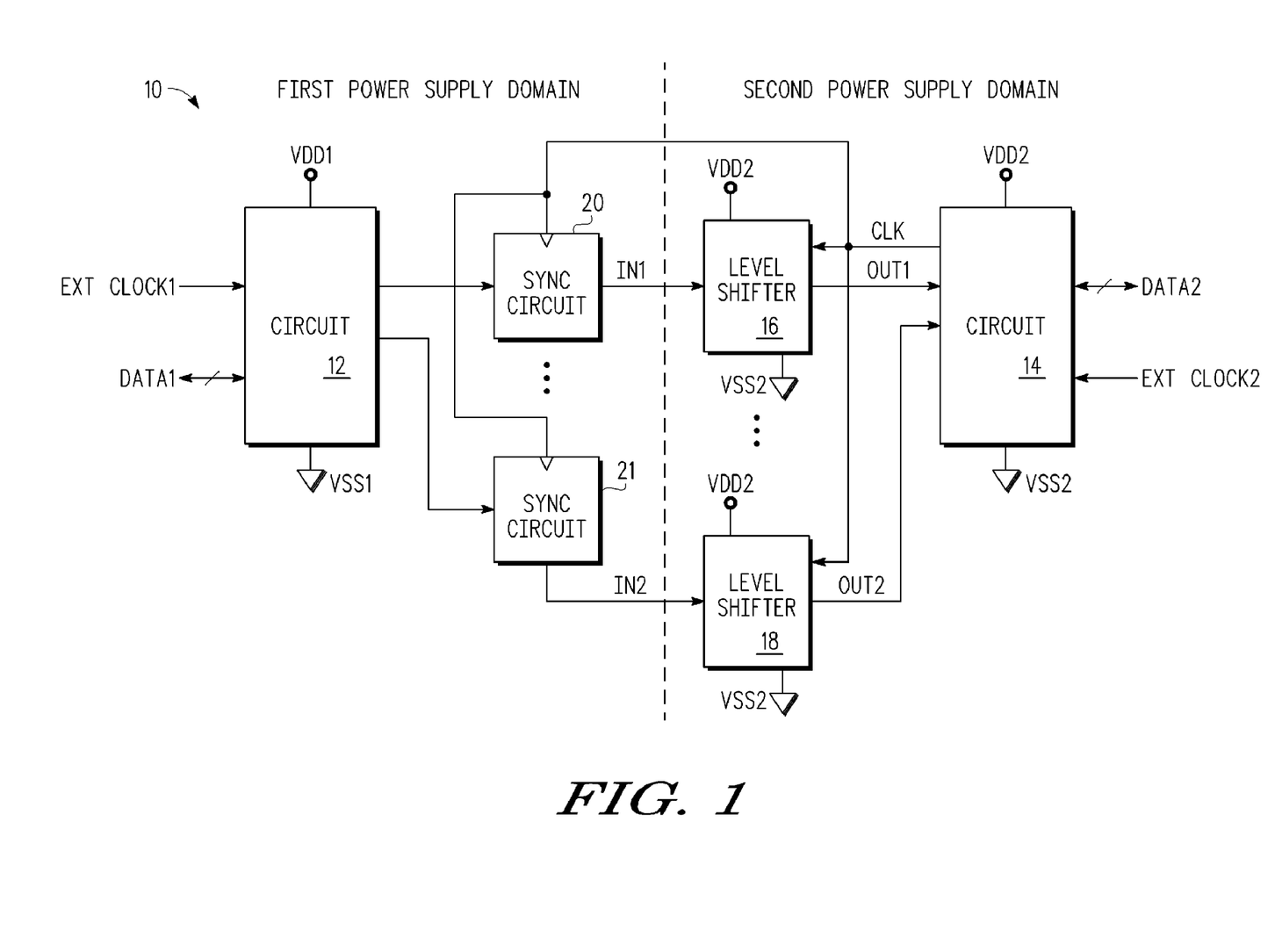
FIG. 1 illustrates, in block diagram form, a circuit in accordance with one embodiment.

FIG. 1 illustrates, in block diagram form, a circuit 10 in accordance with an embodiment. In the illustrated embodiment, circuit 10 can be a multi-chip module or an SOC integrated circuit having multiple modules. In FIG. 1, circuit 10 has a first power supply domain and a second power supply domain separated by a vertical dashed line. In the first power supply domain, the circuits, including a circuit 12 are supplied by a first power supply voltage provided to a first set of power supply terminals. A first power supply terminal is labeled "VDD1" and a second power supply terminal labeled "VSS1". The second power supply domain includes a circuit 14 supplied by a second set of power supply terminals. In the second power supply domain, a second power supply voltage is provided to a third power supply terminal labeled "VDD2" and a fourth power supply terminal labeled "VSS2". The first and second power supply voltages, VDD1 and VDD2 are different from each other. A digital data signal, such as signal IN1 in FIG. 1 is provided by circuit 12. The data signal is referenced to the power supply voltage provided to VDD1 and VSS1. As an example, a voltage value of VDD1 may be at 0.8 volts while VSS1 is at 0.2 volts. The data signals (IN1 and IN2) may have a logic high voltage of about 0.8 volts and a logic low voltage of about 0.2 volts. In other embodiments, the actual logic level voltages of signal IN1 may differ depending on factors such as circuit configuration and integrated circuit manufacturing processes used. The power supply voltage value provided to VDD2 may be at 1.2 volts while VSS2 is at 0.0 volts. In other embodiments, there may be more than two power supply domains. Signals that are communicated between circuit 12 and circuit 14 are level shifted, or buffered, by level shifters such as level shifters 16 and 18. Level shifters 16 and 18 are substantially identical, each receive a single power supply voltage, and are clocked. Control circuits, such as synchronizing circuits 20 and 21 are provided for each level shifter. Note that the synchronizing circuits are located in the first power supply domain and are therefore supplied by VDD1 and VSS1. The clock signal CLK is provided by circuit 14 in the second voltage domain and provided to the synchronizing circuits 20 and 21 in the first power supply domain. The synchronizing circuits insure that the data signals are correctly synchronized with respect to the clock signal. For example, synchronizing circuit 20 is used to insure that an input signal labeled "IN1" provided to level shifter 16 is synchronized with clock signal CLK, and synchronizing circuit 21 is used to insure that an input signal labeled "IN2" provided to level shifter 18 is synchronized with clock signal CLK. Input signals IN1 and IN2 correspond to data signals received at inputs of synchronizing circuits 20 and 21, respectively. The clock signal (CLK) is used to precharge first and second internal nodes of the clocked level shifters to establish a known logic states at the nodes. The nodes remain precharged until the data signals are valid for at least a predetermined setup time period before the clock signal transitions. Level shifter 16 is coupled to power supply terminals VDD2 and VSS2, has an input for receiving input signal IN1, a clock input signal for receiving clock signal CLK, and an output for providing output signal OUT1 to an input of circuit 14. Level shifter 18 is coupled to power supply terminals VDD2 and VSS2, has an input for receiving input signal IN2, a clock input signal for receiving clock signal CLK, and an output for providing output signal OUT2 to an input of circuit 14. Level shifter circuit 18 is substantially identical to level shifter circuit 16. Level shifter circuit 16 will be described in more detail in the discussion of FIG. 2.

Still referring to FIG. 1, in one embodiment, circuit 12 may include an input for receiving an externally generated clock signal labeled "EXT CLOCK1", and a plurality of input/output I/O terminals labeled "DATA1". Also, circuit 14 may include an input for receiving an externally generated clock signal labeled "EXT CLOCK2", and a plurality of I/O terminals labeled "DATA2". Clock signal CLK may be derived from clock signal EXT CLOCK2, or may be internally generated by circuit 14. Circuits 12 and 14 can be any type of electronic circuits that receive different power supply voltages and need to communicate with each other. For example, each of circuits 12 and 14 can include a data processor or processing core, memory, memory controller, analog-to-digital converter (ADC), logic, any other type of circuit, or combination of circuits. Preferably, the circuits of the first and second power supply domains comprise one or more integrated circuits.

Figure 2:
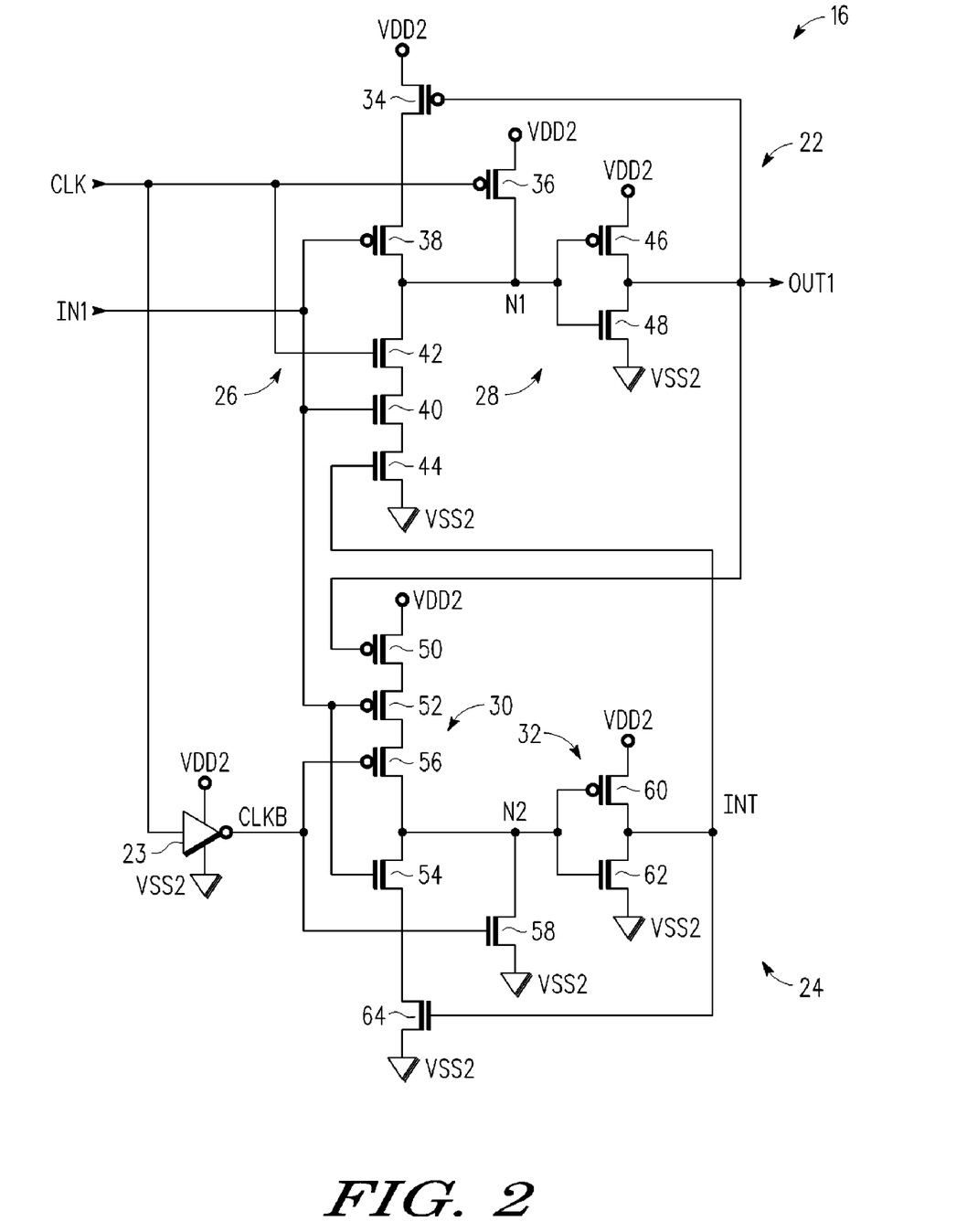
FIG. 2 illustrates, in schematic diagram form, a level shifter of the circuit of FIG. 1.

FIG. 2 illustrates, in schematic diagram form, level shifter 16 of the circuit 10 of FIG. 1. Level shifter 16 is implemented using a conventional CMOS (complementary metal-oxide semiconductor) manufacturing process technology. In other embodiments, circuit elements providing equivalent functionality may be implemented using a different type of processing technology. Level shifter 16 includes a first level shifter portion 22, a second level shifter portion 24, and an inverter 23. Level shifter portion 22 includes inverters 26 and 28, P-channel transistors 36 and 38, and N-channel transistor 44. Level shifter portion 24 includes inverters 30 and 32, P-channel transistor 50, and N-channel transistors 58 and 64.

In level shifter portion 22, inverter 26 includes P-channel transistor 38 and N-channel transistors 40 and 42. Inverter 28 includes P-channel transistor 46 and N-channel transistor 48. P-channel transistor 34 has a source (current electrode) coupled to VDD2, a gate (control electrode) coupled to output terminal OUT1, and a drain (current electrode). P-channel transistor 38 has a source coupled to the drain of transistor 34, a gate for receiving input signal IN1, and a drain coupled to a node labeled "N1". N-channel transistor 42 has a drain coupled to the drain of transistor 38, a gate coupled to receive clock signal CLK, and a source. N-channel transistor 40 has a drain coupled to the source of transistor 42, a gate coupled to the gate of transistor 38, and a source. N-channel transistor 44 has a drain coupled to the source of transistor 40, a gate coupled to an intermediate node labeled "INT", and a source coupled to VSS2. P-channel 36 has a source coupled to VDD2, a gate coupled to the gate of transistor 42 for receiving clock signal CLK, and a drain coupled to node N1. P-channel transistor 46 has a source coupled to VDD2, a gate coupled to node N1, and a drain coupled to output terminal OUT1. N-channel transistor 48 has a drain coupled to the drain of transistor 46 at output terminal OUT1, a gate coupled to node N1, and a source coupled to VSS2.

In second level shifter portion 24, P-channel transistor 50 has a source coupled to VDD2, a gate coupled to the output terminal OUT1 of level shifter portion 22, and a drain. P-channel transistor 52 has a source coupled to the drain of transistor 50, a gate coupled to receive input signal IN1, and a drain. P-channel transistor 56 has a source coupled to the drain of transistor 52, a gate coupled to an output terminal if inverter 23 for receiving an inverted clock signal CLK, and a drain coupled to a node labeled "N2". N-channel transistor 54 has a drain coupled to node N2, a gate coupled to the gate of transistor 52, and a source. N-channel transistor 64 has a drain coupled to the source of transistor 54, a gate coupled to the intermediate terminal INT, and a source coupled to VSS2. N-channel transistor 58 has a drain coupled to node N2, a gate coupled to the output of inverter 23, and a source coupled to VSS2. P-channel transistor 60 has a source coupled to VDD2, a gate coupled to node N2, and a drain coupled to intermediate terminal INT. N-channel transistor 62 has a drain coupled to the drain of P-channel transistor 60, a gate coupled to the gate of transistor 60 at node N2, and a source coupled to VSS2.

Figure 3:
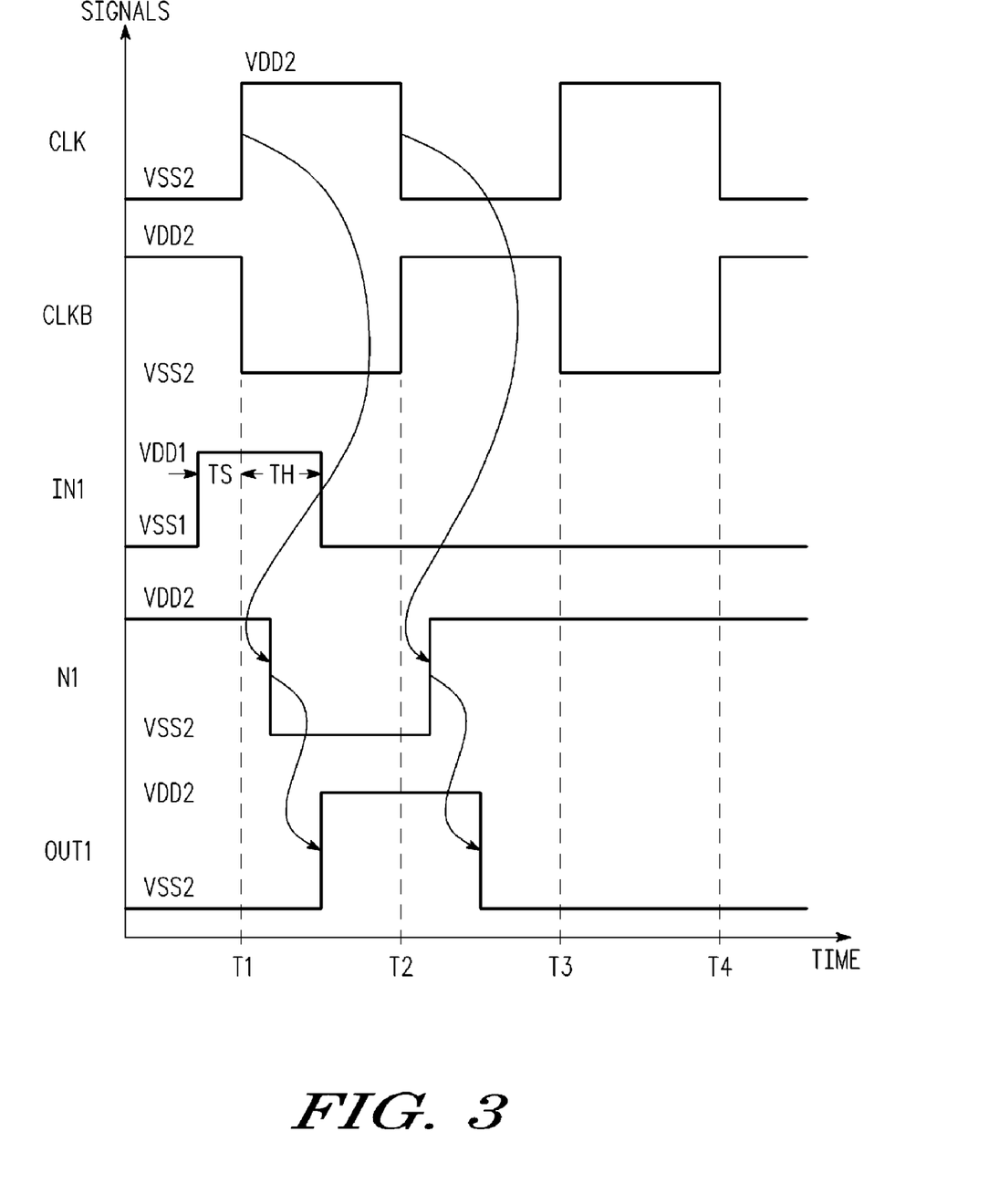
FIG. 3 illustrates a timing diagram of various signals of the circuit of FIG. 2.

FIG. 3 illustrates a timing diagram of various signals of level shifter circuit 16 of FIG. 2. The operation of level shifter 16 will be described with reference to FIGS. 1-3. Inverter 26 receives an input signal IN1 at a first rail-to-rail voltage and provides a level shifted output signal OUT1 at a second rail-to-rail voltage that is different than the first rail-to-rail voltage in response to a clock signal CLK. Clock signal CLK is provided from circuit 14 of the second power supply domain. In the illustrated embodiment, the power supply voltage VDD2 from the second power supply domain is a higher voltage than power supply voltage VDD1 from the first power supply domain. Prior to time T1 in FIG. 3, node N1 is precharged to VDD2 when clock signal CLK is a logic low voltage. Node N1 is an intermediate point between inverters 26 and 28. In other embodiments, the precharging may take place during a different portion of clock signal CLK. The logic low clock signal causes the precharging P-channel transistor 36 to be conductive and provide a voltage at node N1 at about VDD2. Clock signal CLK is also provided to N-channel transistor 42 of inverter 26, which becomes substantially non-conductive in response. At the same time, node N2 of level shifter portion 24 is precharged low to about VSS2 through N-channel transistors 56 and 58 by clock signal CLK and inverter 23. As can be seen in FIG. 2, portion 24 is essentially a mirror image of portion 22 and receives an inverted clock signal CLKB through inverter 23. Note that in other embodiments, instead of using inverter 23, differential clock signals CLK and CLKB may be provided by circuit 14. After node N1 is precharged and prior to the rising edge of clock signal CLK, input signal IN1 transitions. For purposes of illustration, input signal IN1 transitions from a logic low voltage equal to about VSS1 to a logic high voltage equal to about VDD1. Input signal IN1 should be relatively steady state a predetermined set-up time prior to the rising edge of clock signal CLK at time T1. This predetermined set-up time is labeled "TS" in FIG. 3 and is determined by, for example, the clock frequency, voltage level, processing technology, etc. In the illustrated embodiment, synchronizing circuit 20 is used to insure the set-up time TS. Various conventional techniques may be used to control, or synchronize, input signal IN1. For example, in one embodiment, synchronizing circuit 20 causes input signal IN1 to transition a certain time after a falling edge of clock signal CLK to insure set-up time TS. In another embodiment, synchronizing circuit 20 causes input signal IN1 to transition on a previous clock edge of clock signal CLK to insure input signal IN1 is steady state prior to clock signal CLK becoming a logic high. A logic high clock signal CLK ends the precharge of node N1 by causing P-channel transistor 36 to be non-conductive and causing N-channel transistor 42 to be conductive. During the precharge period, transistor 42 is turned off by the logic low CLK signal to allow transistor 36 to increase the voltage of node N1. When the CLK signal is a logic high, transistor 42 functions to enable inverter 26 to pull node N1 down in response to a logic high input signal IN1. Between times T1 and T2 node N1 is pulled to a logic low voltage in response to the logic high input signal IN1. To pull node N1 low, transistors 42, 40, and 44 must be conductive. The logic high clock signal CLK causes transistor 42 to be conductive. The logic high input signal IN1 causes transistor 40 to be conductive, and a logic high intermediate signal INT from level shifter portion 24 causes transistor 44 to be conductive. At the same time, the logic high output signal OUT1 causes transistor 50 to be non-conductive to prevent a crowbar current through transistors 50, 52, and 56. The logic high node N1 causes the voltage of output signal OUT1 to be pulled to a logic high voltage of about VDD2 via inverter 28. Transistor 34 is coupled in series between VDD2 and inverter 26. To prevent a crowbar current between VDD2 to VSS2, the output signal OUT1 is fed back to turn transistor 34 off. Also, the output signal OUT1 is provided to turn transistor 50 off to prevent a crowbar current in level shifter portion 24.

Input signal remains high at least long enough to allow a corresponding level shifted logic high output signal OUT1 to be provided. Input signal IN1 can transition to a logic low a predetermined hold-time "TH" after time T1. At time T2, clock signal CLK transitions to a logic low voltage, starting another precharge operation. Between times T2 and T3 the falling edge of clock signal CLK causes node N1 to be precharged to about VDD2. A predetermined set-up time before clock CLK transitions high at time T3, input signal IN1 transitions, or as illustrated in FIG. 3, remains a logic low voltage. At time T3, clock signal CLK transitions to a logic high ending the precharge operation of node N1 and allowing node N1 to transition high. The logic high voltage of node N1 causes output signal OUT1 to be reduced to VSS2 making both transistors 34 and 50 conductive, thus reinforcing the logic high node N1. In this example, supply voltage VSS2 is 0 volts while VSS1 is 0.2 volts. The logic low voltage of IN1 has been level shifted to VSS2. Clock signal CLKB causes node N2 of portion 24 to be precharged to a logic low. The output signal OUT1 becomes low via inverter 32, and intermediate signal INT becomes high. Also, the logic low clock signal CLKB ends the precharge operation of node N2. Node N1 does not transition and remains at the precharge voltage. Output signal OUT1 is a logic low voltage causing transistors 34 and 50 to be conductive. Node N2 is a logic high and the logic low signal INT causes transistor 44, which is coupled in series between VSS2 and inverter 26, to be substantially non-conductive preventing a crowbar current through level shifter portion 22.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different circuits. For example, although FIG. 1 and the discussion thereof describe an exemplary circuit, this exemplary circuit is presented merely to provide a useful reference in discussing various aspects of the invention. Of course, the description of the circuit has been simplified for purposes of discussion, and it is just one of many different types of appropriate circuits that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of circuit 10 are circuitry located on a single integrated circuit or within a same device. Alternatively, circuit 10 may include any number of separate integrated circuits or separate devices interconnected with each other. For example, circuit 12 may be located on a same integrated circuit or on a separate integrated circuit or located within another peripheral or slave discretely separate from other elements of circuit 10. Circuit 14 may also be located on separate integrated circuits or devices from circuit 12.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:

first circuitry having a first set of first and second power terminals for being powered by a first power supply domain, the first circuitry providing a data signal referenced to the first power supply domain;

second circuitry having a second set of first and second power terminals for being powered by a second power supply domain having supply voltages that differ from the first power supply domain, the second circuitry providing the data signal referenced to the second power supply domain; and a clocked level shifter for coupling the first circuitry to the second circuitry, the clocked level shifter buffering the data signal from the first power supply domain to the second power supply domain by only using a single supply voltage wherein voltage values on both first and second power terminals of the second set differ from the first and second power terminals of the first set, the clocked level shifter being clocked by a clock signal that is used to precharge a first node and a second node of the clocked level shifter until the data signal is valid for at least a setup time period, precharging the first and second nodes being used to establish a known state in the clocked level shifter.

2. The circuit of claim 1 wherein the clocked level shifter further comprises:

a first level shifter portion having a data input for receiving the data signal, the first level shifter portion comprising:

a first inverter coupled to the data input and having an output coupled to the first node;

a first transistor coupled in series between the first power terminal of the second set and the first inverter, the first transistor having a control terminal;

a second transistor coupled in series between the first inverter and the second power terminal of the second set;

a second inverter having an input coupled to the first node and an output coupled to the control terminal of the first transistor; and a first precharge transistor coupled between the first power terminal of the second set and the first node, the first precharge transistor having a control terminal for receiving the clock signal; and a second level shifter portion having a data input for receiving the data signal, the second level shifter portion comprising:

a third inverter coupled to the data input and having an output coupled to the second node;

a third transistor coupled in series between the first power terminal of the second set and the third inverter, the third transistor having a control terminal coupled to the output of the second inverter;

a fourth transistor coupled in series between the third inverter and the second power terminal of the second set;

a fourth inverter having an input coupled to the second node and an output coupled to the control terminal of the second transistor; and a second precharge transistor coupled between the second power terminal of the second set and the second node, the second precharge transistor having a control terminal for receiving an inverse of the clock signal.

3. The circuit of claim 2 further comprising:

control circuitry for controlling when a rising edge of the clock signal occurs relative to an edge transition of the data signal.

4. The circuit of claim 2 further comprising:

a fifth inverter having an input for receiving the clock signal and an output coupled to the control terminal of the second precharge transistor.

5. The circuit of claim 4 wherein the first inverter comprises sixth and seventh transistors coupled in series and the first level shifter portion further comprises:

an eighth transistor coupled between the sixth and seventh transistors, the eighth transistor having a control terminal coupled to the clock signal.

6. The circuit of claim 5 wherein the third inverter comprises ninth and tenth transistors coupled in series and the second level shifter portion further comprises:

an eleventh transistor coupled between the ninth and tenth transistors, the eleventh transistor having a control terminal coupled to the inverse of the clock signal.

7. The circuit of claim 1 further comprising:

control circuitry coupled to the clocked level shifter for ensuring that the data signal is valid for at least the setup time period.

8. A circuit comprising:

first circuitry within a first power supply domain having a first set of first and second power terminals for being powered by a first power supply and providing a data signal referenced to the first power supply;

second circuitry within a second power supply domain having a second set of first and second power terminals for being powered by a second power supply, the second power supply differing from the first power supply, the second circuitry providing the data signal referenced to the second power supply; and a clocked level shifter coupled between the first circuitry and the second circuitry, the clocked level shifter buffering the data signal from the first power supply to the second power supply by only using a single supply voltage, the clocked level shifter using a clock signal to bias an output of the clocked level shifter to a known state, the output not being biased to the known state after a setup time has elapsed upon receipt of valid data, the clocked level shifter comprising a series-connected plurality of transistors, at least one of which is assured of being nonconductive during a valid output state of the clocked level shifter to thereby prevent current leakage.

9. The circuit of claim 8 wherein the clocked level shifter further comprises:

a first level shifter portion having a data input for receiving the data signal, the first level shifter portion comprising:

a first inverter coupled to the data input and having an output coupled to a first node;

a first transistor coupled in series between the first power terminal of the second set and the first inverter, the first transistor having a control terminal;

a second transistor coupled in series between the first inverter and the second power terminal of the second set;

a second inverter having an input coupled to the first node and an output coupled to the control terminal of the first transistor; and a first precharge transistor coupled between the first power terminal of the second set and the first node, the first precharge transistor having a control terminal for receiving the clock signal; and a second level shifter portion having a data input for receiving the data signal, the second level shifter portion comprising:

a third inverter coupled to the data input and having an output coupled to a second node;

a third transistor coupled in series between the first power terminal of the second set and the third inverter, the third transistor having a control terminal;

a fourth transistor coupled in series between the third inverter and the second power terminal of the second set;

a fourth inverter having an input coupled to the second node and an output coupled to the control terminal of the second transistor; and a second precharge transistor coupled between the second power terminal of the second set and the second node, the second precharge transistor having a control terminal for receiving an inverse of the clock signal.

10. The circuit of claim 9 further comprising:

control circuitry for controlling when a rising edge of the clock signal occurs relative to an edge transition of the data signal.

11. The circuit of claim 9 further comprising:

a fifth inverter having an input for receiving the clock signal and an output coupled to the control terminal of the second precharge transistor.

12. The circuit of claim 11 wherein the first inverter comprises sixth and seventh transistors coupled in series and the first level shifter portion further comprises:

an eighth transistor coupled between the sixth and seventh transistors, the eighth transistor having a control terminal coupled to the clock signal.

13. The circuit of claim 12 wherein the third inverter comprises ninth and tenth transistors coupled in series and the second level shifter portion further comprises:

an eleventh transistor coupled between the ninth and tenth transistors, the eleventh transistor having a control terminal coupled to the inverse of the clock signal.

14. The circuit of claim 8 further comprising:

control circuitry coupled to the clocked level shifter for ensuring that the data signal is valid for at least the setup time period.

15. The circuit of claim 8 wherein the first power supply domain comprises first and second power rails and the second power supply domain comprises third and fourth power rails, wherein voltage conducted by the first power rail and the third power rail having differing values and voltage conducted by the second power rail and the fourth power rail is a same voltage value.

16. The circuit of claim 8 wherein the first power supply domain comprises first and second power rails and the second power supply domain comprises third and fourth power rails, wherein voltage conducted by the first power rail and the third power rail having differing values and voltage conducted by the second power rail and the fourth power rail also have differing values.

17. A level shifting circuit comprising:
a first transistor of a first conductivity type having a first current electrode coupled to a first power supply terminal referenced to a first voltage domain, a control electrode and a second current electrode;
a second transistor of the first conductivity type having a first current electrode coupled to the second current electrode of the first transistor, a control electrode for receiving a data signal referenced to a second voltage domain different from the first voltage domain, and a second current electrode coupled to a first internal node;
a third transistor of a second conductivity type having a first current electrode coupled to the second current electrode of the second transistor, a control electrode for receiving a clock signal, and a second current electrode;
a fourth transistor of the second conductivity type having a first current electrode coupled to the second current electrode of the third transistor, a control electrode for receiving the data signal, and a second current electrode;
a fifth transistor of the second conductivity type having a first current electrode coupled to the second current electrode of the fourth transistor, a control electrode for receiving a leakage current control signal, and a second current electrode coupled to a second power supply terminal referenced to the first voltage domain;
a sixth transistor of the first conductivity type having a first current electrode coupled to the first power supply terminal referenced to the first voltage domain, a control electrode for receiving the clock signal, and a second current electrode coupled to the first internal node; and
a first inverter having an input coupled to the first internal node, a first power electrode coupled to the first power supply terminal referenced to the first voltage domain, a second power electrode coupled to the second power supply terminal referenced to the first voltage domain, and an output for providing a level shifted form of the data signal as an output signal and coupled to the control electrode of the first transistor.

18. The level shifting circuit of claim 17 wherein the first, second and sixth transistors are P-channel transistors and the third, fourth and fifth transistors are N-channel transistors.

19. The level shifting circuit of claim 17 further comprising:
a seventh transistor of the first conductivity type having a first current electrode coupled to the first power supply terminal referenced to the first voltage domain, a control electrode coupled to the output of the first inverter, and a second current electrode;
an eighth transistor of the first conductivity type having a first current electrode coupled to the second current electrode of the seventh transistor, a control electrode for receiving the data signal referenced to the second voltage domain, and a second current electrode;
a ninth transistor of the first conductivity type having a first current electrode coupled to the second current electrode of the eighth transistor, a control electrode for receiving an inversion of the clock signal, and a second current electrode coupled to a second internal node;
a tenth transistor of the second conductivity type having a first current electrode coupled to the second current electrode of the ninth transistor, a control electrode for receiving the data signal, and a second current electrode;
an eleventh transistor of the second conductivity type having a first current electrode coupled to the second current electrode of the tenth transistor, a control electrode for receiving the leakage current control signal, and a second current electrode coupled to the second power supply terminal referenced to the first voltage domain;
a twelfth transistor of the first conductivity type having a first current electrode coupled to the second internal node, a control electrode for receiving an inverse of the clock signal, and a second current electrode coupled to the second power supply terminal referenced to the first voltage domain; and
a second inverter having an input coupled to the second internal node, a first power electrode coupled to the first power supply terminal referenced to the first voltage domain, a second power electrode coupled to the second power supply terminal referenced to the first voltage domain, and an output for providing the leakage current control signal.

20. The level shifting circuit of claim 19 wherein the seventh, eighth and ninth transistors are P-channel transistors and the tenth, eleventh and twelfth transistors are N-channel transistors.

* * * * *